United States Patent

Oswald et al.

[15] 3,657,609

[45] Apr. 18, 1972

[54] ELECTRICAL DEVICE CONTROLLED BY AT LEAST TWO TUNABLE CAPACITANCE DIODES

[72] Inventors: Gernot Oswald; Wolfgang Wenzig, both of Munich; Hugo Ruchardt, Gauting, all of Germany

[73] Assignee: Siemens Aktiengesellschaft, Berlin, Munich, Germany

[22] Filed: Oct. 15, 1969

[21] Appl. No.: 866,487

[30] Foreign Application Priority Data

Oct. 18, 1968 Germany ......................P 18 03 883.0

[52] U.S. Cl. ..............................................317/234, 317/235

[51] Int. Cl. ..........................................................H01g 9/06

[58] Field of Search ..........................................317/234, 235

[56] References Cited

UNITED STATES PATENTS 2,717,343 9/1955 Hall ......................................317/235
2,721,965 10/1955 Hall ......................................317/235
2,929,006 3/1960 Herlet....................................317/235
3,062,690 11/1962 Ross.....................................317/235 X
3,344,263 9/1967 Gere et al. .........................317/235 X

*Primary Examiner*—James D. Kallam
*Attorney*—Curt M. Avery, Arthur E. Wilfond, Herbert L. Lerner and Daniel J. Tick

[57] ABSTRACT

Electrical device controlled by at least two tunable capacitance diodes and means impressing a tunable voltage upon said diodes. The device is so characterized that the capacitance diodes which are combined, in a known manner, within a single semiconductor crystal, have as their common component, a surface region produced at one flat side of the semiconductor crystal, whose boundary to the semiconductor crystal is at least essentially parallel to the flat semiconductor surface. The other component of the capacitance diodes, simultaneously produced regions are embedded therein. The embedded regions of opposite conductance type are so arranged over the entire area of the surface region and provided for the individual tuning diodes. Each square amounting to a maximum of 20 percent of the total area of the surface region, contains at least a portion of the active PN-junctions of each of the provided tuning diodes.

8 Claims, 3 Drawing Figures

ELECTRICAL DEVICE CONTROLLED BY AT LEAST TWO TUNABLE CAPACITANCE DIODES

The invention relates to electrical devices which are controlled by tunable capacitance diodes and means for impressing a biasing voltage upon said diodes. For example, the invention relates to two high frequency amplifying stages of a high frequency amplifier with capacitative tuning whereby the capacitative tuning members are predetermined in form of two controllable capacitance diodes. The synchronism or the parallelism of the capacitance values of said diodes, which is of importance for the tuning of the amplifier is mainly obtained with switching measures which are not the object of this invention. However, in addition to said measures, means can be employed with respect to the construction of the tuning diodes, which act to improve the synchronism or the parallelism and can be produced with switching means.

The invention relates to an electrical device, controlled by at least two tunable capacitance diodes and means that impress a tunable biasing voltage upon said diodes. The electrical device of the present invention is characterized in that the capacitance diodes which are combined, in a known manner, in a single semiconductor crystal are provided with a common component in form of a surface region, produced on one flat side of the semiconductor crystal whose boundary with the semiconductor crystal extends, at least essentially, in parallel to the flat semiconductor surface. Two simultaneously produced regions of opposite conductance type are embedded into the device as the other component of the capacitance diodes. These regions of opposite conductance type are so arranged across the exposed total surface of the surface region and subordinated to the individual tuning diodes that each square totaling a maximum of 20 percent of the total surface of the surface region contains at least a portion of the active PN junction of each of the provided tuning diodes.

The invention also relates to an electrical device which is controlled by at least two tunable capacitance diodes and to means which impress said diodes with tunable biasing or blocking voltage, whereby the capacitance diodes, combined in a known manner, within a single semiconductor crystal have, as a common component, a surface region, produced at one flat side of the semiconductor crystal, whose boundary with the semi-conductor crystal extends, at least essentially, in parallel with the planar semiconductor surface. As another component of the capacitance diodes, the electrical device is provided with a number of regions of opposite conductance type, with a total area F. The embedded regions are so densely distributed across the total area F and subordinated to the diodes, that each square amounting to a maximum of 20 percent of the total area F contains at least a portion of the active PN junction of each of the provided tuning diodes.

The first one of these measures serves for an equal distribution of systematic errors, associated with the production of the surface region, while the second measure is intended to balance the effect of systematic errors associated with the production of the embedded regions of opposite conductance type.

The surface region wherein regions of opposite conductance type are embedded, preferably constitutes a single, coherent structure, since this is most suitable for the present invention. Hence, the embodiment examples, disclosed below, relate only to this instance. To produce a surface region in a semiconductor crystal whose boundary extends, essentially, in parallel to a flat surface part of a semiconductor monocrystal, it is preferable to diffuse dopant from the gaseous phase, into the crystal at the flat surface portion, whereby an appropriate selection of the dopants will produce a boundary which is effective for the electrical performance of the device, with respect to the original material of the semiconductor crystal. An alternative thereto, which should be employed in many instances, is the production of the surface region through epitatic precipitation of doped semiconductor material, from the gaseous phase, that is through vapor depositions or a thermal reaction of an appropriate reaction gas.

The boundary between the surface region and the original material of the semiconductor crystal can be a PN junction, if a particularly strong decoupling of the tuning diode is desired. The surface region must then be contacted by applying a particularly barrier free contact. It is, therefore, expedient in many cases that the material of the original semiconductor crystal is of the same conductance type as the surface region, but doped much higher than the latter. This type of configuration can either be produced by diffusing dopant out of the highly doped original semiconductor crystal whereby all locations where "out-diffusion" is not desired, are provided with a diffusion mask. It is much simpler however, and more advantageous, to deposit the low doped surface region through epitaxy, from the gaseous phase.

In the last mentioned example, the original crystal can function as a common terminal electrode for all capacitance diodes. For this reason, the boundary area between the two regions is of importance for the electrical function of all diodes.

The regions of opposite conductance type, embedded into the surface region and required for the completion and characteristics of the individual diodes, are preferably simultaneously produced through a masked diffusion of an activator which produces the opposite conductance type of the embedding surface region, from the gaseous phase. The placing, or the dimensioning of said regions within the surface region is carried out according to the invention. Embodiments are shown in FIGS. 1 to 3, which are described as follows.

Figure 1:
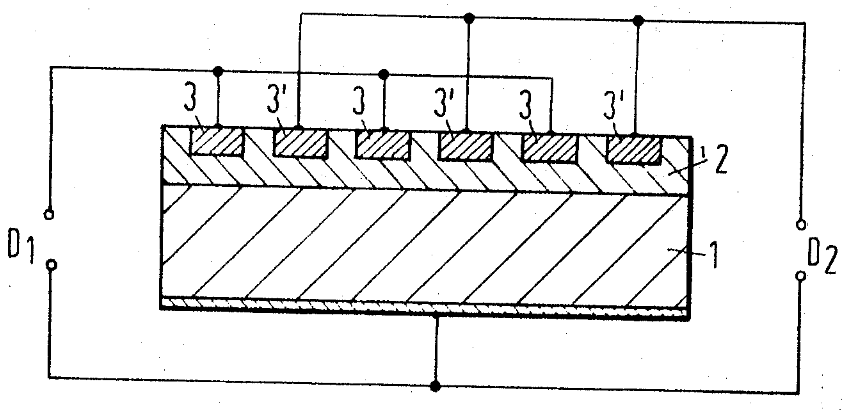
FIG. 1 is a longitudinal section through a diode arrangement according to the invention.

On FIG. 1, the original crystal 1 is provided on its flat side with an embedding surface region 2 of one conductance type in which are embedded strip like surface regions 3,3', of opposite conductance type. These strip like regions do not contact the original crystal 1. The strip like regions extend vertically to the plane of drawing and parallel to each other and can, if necessary, stretch across the entire width of the surface region so that the embedded regions more or less form a lattice comprised of parallel, separated strips. The lattice strips 3, 3', of which there is preferably an even number are contacted through an electrical union of the uneven strips 3, or the even strips 3+. It is also possible to effect the contacting with the aid of conductive paths which are placed upon an insulated coating that covers the device. As shown in the drawing, the contacting can also be effected with the aid of fine wires 4. In the latter embodiment, two equal tuning diodes $D_1$, $D_2$ are formed. The fastening of these wires at the semiconductor surface or at the electrodes, which contact region 3, can be carried out in this instance by thermocompression. The dimensioning and placing of the strips 3,3' is done according to the teaching of the invention, whereby care must be taken that each square comprising a maximum of 20 percent of the exposed total surface of the surface region, contain at least one part of the active PN junction of each of the provided tuning diodes $D_1$, $D_2$. The strips 3,3' must be arranged at sufficient closeness, in order to comply with the teaching of the invention. This applies especially to the instance where a plurality of diodes is to be produced. PN-junction To make the effect of the invention more understandable, we refer to the presence of so called systematic errors in the devices, produced in a conventional manner. Such errors are also feasible in integrated devices. For example, the thickness on the diffusion depth of the surface region 2 can vary. Experience has shown that these errors are not statistically distributed but are increasingly emphasized, while progressing in one direction. When regions 3, which form the individual diodes in a device, according to FIG. 1 are rather uniformly distributed across the semiconductor surface of region 2, then both diodes will also participate, rather uniformly, in the effects of such systematic errors. Thus, they can no longer have a decisive effect upon one of the diodes.

Figure 2:
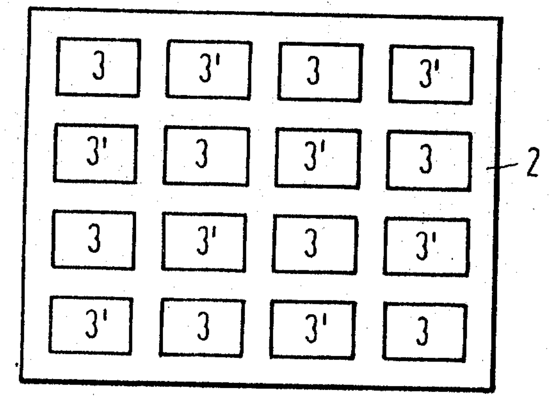
FIG. 2 shows in plan view a second configuration.

In addition to the "lattice-type" arrangement of the embedded surface regions 3,3′ which are used in FIG. 1, these regions can also be arranged in the surface region 2 like fields of a chess board, as shown in FIG. 2. The regions 3 again correspond to one diode, and regions 3′ to the other diode. They are, again, joined together by contact means arranged outside the semiconductor.

Figure 3:
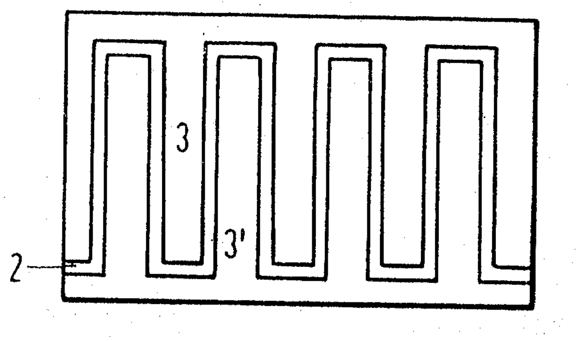
FIG. 3 shows in plan view a third configuration.

According to a third embodiment the surface regions 3,3′ meander in a manner illustrated in FIG. 3, whereby the individual teeth must be given adequate height or an adequately close arrangement must be ensured for them.

In the interest of an exact synchronism for the capacitance functions of the tuning diodes, equal dimensioning of the surface regions, subordinated to the individual tuning diodes, must be ensured. If parallelism is desired rather than synchronism (as for example when one diode controls the oscillator and the other diode the mixed circuit of a superimposed receiver), the surface regions, subordinated to the individual diodes, will be dimensioned to differ accordingly. Care must still be taken, so as to distribute the surface regions, subordinated to the diodes, at a certain uniformity across the entire surface, according to our invention.

As a further development, we suggest to make sure that the entire periphery of the embedded regions, provided for the individual diodes, have the same value of the subordinated total area of said zones, for all diodes. This will comply with the requirement that the influence of the edge portions of the PN-junctions acts differently upon the voltage dependence of the diode capacitance, than that of the central flat portions.

We claim:

1. An electrical device controlled by at least two tunable capacitance diodes and means impressing a tunable biasing voltage upon said diodes, the capacitance diodes, combined within a single semiconductor crystal, have as their common component a surface region produced at one flat side of the semiconductor crystal, the boundary of the surface region to the semiconductor crystal is at least essentially parallel to the flat semiconductor surface, the other component of the capacitance diodes constituting a plurality of embedded regions of opposite conductance type within a surface region F and provided for the individual tuning diodes, said embedded zones being so densely distributed over the surface region F, that each square amounting to a maximum of 20 percent of said surface region F, contains at least a portion of the active PN-junctions of each of the provided capacitance diodes.

2. The device of claim 1, wherein the surface region covers an entire flat side of a wafer shaped, monocrystalline semiconductor body, particularly made of silicon wherein the embedded regions are produced through diffusion, according to the planar technique.

3. The device of claim 1 wherein the surface region is produced by means of epitaxy, upon a higher-doped substrate of the same conductance type.

4. The device of claim 1 wherein two embedded regions belong to at least one of the capacitance diodes.

5. The device of claim 4, wherein the embedded regions of the capacitance diodes are mutually toothed.

6. The device of claim 1 wherein an even number of embedded regions are provided, half of which are assigned to the two provided capacitance diodes and distributed over the surface of the surface region, in an alternating chessboard like pattern.

7. The device of claim 1 wherein the embedded regions provided for each of the capacitance diodes are of different size or shape, while the total rim length for all provided capacitance diodes is in equal proportion to the respective total area.

8. An electrical device controlled by at least two tunable capacitance diodes and means impressing a biasing blocking voltage upon said diodes, according to claim 7, wherein the capacitance diodes, combined within a single semiconductor crystal, have as a common component a surface region produced at one flat side of the semiconductor crystal, whose boundary with the semiconductor crystal extends, at least essentially, parallel to the flat semiconductor surface, while as the other component of the capacitance diodes, a number of regions of opposite conductance type, having a total area F, are embedded and are distributed over the total area F at such density and provided for the diodes, that each square totaling a maximum of 20 percent of the total area F contains at least a part of the active PN-junction of each of the provided tuning diodes.

* * * * *